(12) United States Patent
Meng et al.

(10) Patent No.: US 9,939,936 B2
(45) Date of Patent: Apr. 10, 2018

(54) OGS TOUCH SCREEN SUBSTRATE BRIDGE STRUCTURE AND MANUFACTURING METHOD THEREOF, OGS TOUCH SCREEN AND ITS MANUFACTURING METHOD AS WELL AS DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Qingchao Meng, Beijing (CN); Weigang Gong, Beijing (CN); Chengzhu Lu, Beijing (CN); Xiaofeng Wang, Beijing (CN)

(73) Assignees: BOE TECHNOLOGY GROUP CO., LTD., Beijing (CN); HEIFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/768,954

(22) PCT Filed: Dec. 13, 2014

(86) PCT No.: PCT/CN2014/093768
§ 371 (c)(1),
(2) Date: Aug. 19, 2015

(87) PCT Pub. No.: WO2016/037430
PCT Pub. Date: Mar. 17, 2016

(65) Prior Publication Data
US 2016/0252990 A1    Sep. 1, 2016

(30) Foreign Application Priority Data

Sep. 11, 2014  (CN) .......................... 2014 1 0462843

(51) Int. Cl.
*G06F 3/041* (2006.01)
*H05K 1/02* (2006.01)
(Continued)

(52) U.S. Cl.
CPC .............. *G06F 3/041* (2013.01); *G06F 3/044* (2013.01); *H05K 1/0296* (2013.01); *H05K 1/115* (2013.01);
(Continued)

(58) Field of Classification Search
None
See application file for complete search history.

(56) References Cited

U.S. PATENT DOCUMENTS 9,018,535 B2 *  4/2015  Zeng ...................... H01H 11/00
                                                      349/12
2014/0043257 A1  2/2014  Lee et al.
(Continued)

FOREIGN PATENT DOCUMENTS

| CN | 101692193 A | 4/2010 |
|---|---|---|
| CN | 103455203 A | 12/2013 |
| CN | 103914163 A | 7/2014 |

OTHER PUBLICATIONS

International Search Report with English translation and Written Opinion both dated Jun. 19, 2015; PCT/CN2014/093768.
(Continued)

*Primary Examiner* — Kenneth B Lee, Jr.
(74) *Attorney, Agent, or Firm* — Ladas & Parry LLP

(57) ABSTRACT

A one-glass-solution (OGS) touch screen substrate bridge structure and its manufacturing method, an OGS touch screen and its manufacturing method as well as a display device. The OGS touch screen substrate bridge structure includes: one insulating layer and two layers of transparent electrodes provided on the substrate, the two layers of
(Continued)

transparent electrodes are the first transparent electrode and the second transparent electrode, the insulating layer is provided on the first transparent electrode, and the second transparent electrode is provided on the insulating layer, the first transparent electrode includes several sub-electrodes arranged at a certain spacing from each other, the second transparent electrode keeps the sub-electrodes in electrical connection. In the above, by forming the bridge structure with one insulating layer and two layers of transparent electrodes, it is possible to avoid the provision of redundant insulating layer, thus decrease the possibility that the bridge structure become visible, improving the display effect of a display device.

14 Claims, 3 Drawing Sheets

(51) Int. Cl.
  *H05K 1/11* (2006.01)
  *H05K 3/10* (2006.01)
  *G06F 3/044* (2006.01)
  *H05K 3/46* (2006.01)

(52) U.S. Cl.
  CPC ............. *H05K 3/10* (2013.01); *H05K 3/4685* (2013.01); *G06F 2203/04103* (2013.01); *G06F 2203/04111* (2013.01); *H05K 2201/0108* (2013.01); *H05K 2201/10128* (2013.01)

(56) References Cited

U.S. PATENT DOCUMENTS

| | | | |
|---|---|---|---|
| 2014/0184945 A1* | 7/2014 | Zhou | G02F 1/13338 349/12 |
| 2015/0062455 A1 | 3/2015 | Hao et al. | |

OTHER PUBLICATIONS

First Chinese Office Action dated Sep. 13, 2016; Appln. No. 201410462843.3.
Second Chinese Office Action dated Jan. 24, 2017; Appln. No. 201410462843.3.
The Third Chinese Office Action dated Jun. 12, 2017; Appln. No. 201410462843.3.

* cited by examiner

OGS TOUCH SCREEN SUBSTRATE BRIDGE STRUCTURE AND MANUFACTURING METHOD THEREOF, OGS TOUCH SCREEN AND ITS MANUFACTURING METHOD AS WELL AS DISPLAY DEVICE

TECHNICAL FIELD

At least one embodiment of the present invention relates to a one-glass-solution (OGS) touch screen substrate bridge structure and a manufacturing methods thereof, an OGS touch screen and its manufacturing method as well as a display device.

BACKGROUND

One-glass-solution (OGS) touch screen technology is such a technology in which the touch structure is directly formed on the protection glass sheet, for example, such a technique enables the same glass sheet to act as a protection glass sheet while perform the function of touch sensing. OGS touch screens present advantages, such as simple configuration, light weight, thin profile, better light transmittance and so on, and also reduces production costs and improves product yield, because one glass substrate layer and one binding process are eliminated.

SUMMARY

At least one embodiment of the present invention provides a one-glass-solution (OGS) touch screen substrate bridge structure and its manufacturing method, an OGS touch screen and its manufacturing method as well as a display device, so as to improve the display effect of a display device.

At least one embodiment of the present invention provides an OGS touch screen substrate bridge structure, and the OGS touch screen substrate bridge structure comprises one insulating layer and two layers of transparent electrodes provided on the substrate; the two layers of transparent electrodes are a first transparent electrode and a second transparent electrode, the insulating layer is provided on the first transparent electrode, and the second transparent electrode is provided on the insulating layer, the first transparent electrode comprises several sub-electrodes arranged at a certain spacing from each other, and the second transparent electrode keeps the sub-electrodes in electrical connection.

At least one embodiment of the present invention also provides an OGS touch screen comprising the above bridge structure.

At least one embodiment of the present invention also provides a display device comprising the above OGS touch screen.

At least one embodiment of the present invention also provides a method for manufacturing the OGS touch screen substrate bridge structure, the method comprising: forming a first transparent electrode on a substrate, wherein the first transparent electrode comprises several sub-electrodes; forming an insulating layer on the first transparent electrode; and forming a second transparent electrode on the insulating layer, wherein the second transparent electrode keeps the sub-electrodes in electrical connection.

At least one embodiment of the present invention also provides a method for manufacturing the OGS touch screen, the method comprising the above method for manufacturing the OGS touch screen substrate bridge structure.

BRIEF DESCRIPTION OF THE DRAWINGS

For the purpose of describing the technical solution of the embodiment of present invention more clearly, a brief introduction of the attached drawings illustrating the embodiments will be give in the following, and obviously, the drawings described below concern merely some of the embodiments of the present invention, rather than restriction upon the present invention.

REFERENCE NUMERALS

Figure 1:
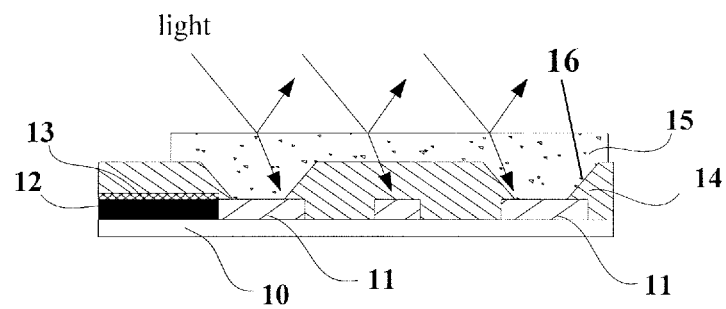
FIG. 1 is a sectional view showing the touch integrate substrate provided by an embodiment of present invention.

10—substrate; 11—first transparent electrode;
12—black matrix; 13—metal lead;
14—insulating layer; 15—second transparent electrode;
20—bridge structure

DETAILED DESCRIPTION

To make even clearer the purpose, the technical solutions and its advantage of the embodiment of the present invention, a clear and complete description about the technical solution of the embodiment of present invention will be made in conjunction with the drawings of the embodiment of present invention. Apparently, the described embodiments are only part of the embodiments of the present invention, rather than all of the embodiments. Based on the described embodiments of present invention, all the other embodiments obtained by the ordinary skilled person in this art without creative endeavors belong to the protective scope of the present invention.

Unless defined otherwise, the technical terms or scientific terminology being used in the present disclosure should take the meaning usually understood by the ordinary skilled in this art of present invention. The phrase "first", "second" and similar terms used herein do not intend to mean any sequence, quantity or importance, but only to distinguish different components. Also, the phrase "one", "a/an" or "the" and similar words does not intend to mean quantitative restriction, but to refer to the existence of at least one. The "comprise" or "contain" and similar words intends to mean that the elements or articles appeared before this word encompass the elements or articles or the equivalent thereof listed after this word, rather than to exclude other elements or articles. The phrase such as "connect" or "couple" and similar words does not intend to be restricted to physical or mechanical connections, but may comprise electrical connection, no matter directly or indirectly. The phrase such as "upper", "lower", "left", "right" and the like are only used to denote a relative positional relationship, and when the described object is changed in its absolute position, this relative positional relationship may also changed accordingly.

In the process of research, the inventors of the present application have noted that, for an OGS technique, the mask plate (Mask) technology is commonly performed for six times, at least two insulating layers and a transparent electrode are commonly employed to make the bridge structure on the substrate, and the dominant problem of the structure of the several insulating layers lies in that the bridge location is likely visible, especially, the wider the line width of the bridge is, the greater the thickness of the insulating layer is, and more visible the bridge location becomes. When the light is incident onto the bridge structure of an OGS touch screen, due to the fact that light is transmitted or deflected in different manners at the transparent electrode and the insulating layers respectively, the bridge location is very easy to be visibly noted, thus influencing the display effect.

In order to improve the display effect of a display device, the embodiments of present invention provides an OGS touch screen substrate bridge structure and its manufacturing method, an OGS touch screen and its manufacturing method as well as a display device, and in the technical solution of an embodiment of present invention, one insulating layer and two layers of transparent electrodes are used to form the bridge structure, it is possible to reduce the redundant insulating layer(s), and in the case where light is irradiated onto the bridge structure, the light has identical effect when being transmitted and reflected at the second transparent electrode, no difference about the light brightness would occur, thus reducing the possibility that the bridge structure becomes visible and improving the display effect of the display device.

First Embodiment

The first embodiment of present invention provides an OGS touch screen substrate bridge structure, the bridge structure comprises one insulating layer and two layers of transparent electrodes provided on the substrate, the two layers of transparent electrodes are a first transparent electrode and a second transparent electrode, the insulating layer is provided on the first transparent electrode, and the second transparent electrode is provided on the insulating layer, the first transparent electrode comprises several sub-electrodes arranged at a certain spacing from each other, and the second transparent electrode keeps the sub-electrodes in electrical connection.

Figure 2:
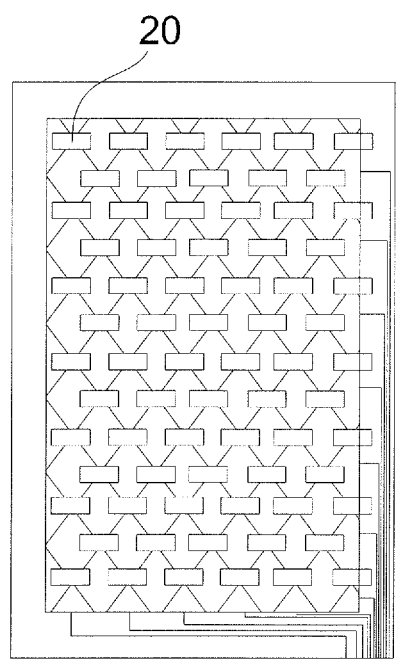
FIG. 2 is a structural schematic view of the OGS touch screen substrate bridge structure provided by an embodiment of present invention.

As shown in FIGS. 1 and 2, the bridge structure 20 of the OGS touch screen substrate comprises one insulating layer 14 and two layers of transparent electrodes (the first transparent electrode 11 and the second transparent electrode 15) provided on the substrate 10, the insulating layer 14 is provided on the first transparent electrode 11, the second transparent electrode 15 is provided on the insulating layer 14, the first transparent electrode 11 comprises several sub-electrodes arranged at a certain spacing from each other, and the second transparent electrode 15 keeps the sub-electrodes in electrical connection.

In the above embodiments, one insulating layer 14 and two layers of transparent electrodes (the first transparent electrode 11 and the second transparent electrode 15) are configured to form the bridge structure 20, it is possible to reduce the redundant insulating layer(s); when light is irradiated onto the bridge structure 20, the light has identical effects when being transmitted and reflected at the second transparent electrode 15, no difference about the light brightness would occur, thus reducing the possibility that the bridge structure 20 becomes visible, and improving the display effect of the display device.

In one example, when the second transparent electrode 15 is coupled with the sub-electrodes, the insulating layer 14 is provided with via holes 16, through which the second transparent electrode 15 is coupled with the sub-electrodes. In the manufacturing process, via holes 16 are formed by etching in the formed insulating layer 14 corresponding to each of the sub-electrodes, and when the second transparent electrode 15 is formed on the insulating layer 14, the second transparent electrode 15 is coupled with the sub-electrodes through via holes 16, thereby keeping the sub-electrodes in a series connection.

Second Embodiment

Referring to FIGS. 1 and 2 again, the embodiment of present invention provides an OGS touch screen comprising any one of the above bridge structures 20.

In the above embodiments, one insulating layer 14 and two layers of transparent electrodes (the first transparent electrode 11 and the second transparent electrode 15) are configured to form the bridge structure 20, it is possible to reduce the redundant insulating layer(s); when light is irradiated onto the bridge structure 20, the light has identical effects when being transmitted and reflected at the second transparent electrode 15, no difference about the light brightness would occur, thus reducing the possibility that the bridge structure 20 becomes visible, and improving the display effect of the display device.

In one example, the touch screen further comprises black matrixes 12 provided on the substrate and metal leads 13 arranged on the black matrixes 12, and the insulating layer 14 covers the metal leads 13.

In above embodiments, the insulating layer 14 covers the metal leads 13 on the substrate 10, thereby reducing at least one of the at least two insulating layers formed on the substrate by conventionally performing mask plate technology for 6 times, it is possible to achieve protection of the metal leads 13 with one insulating layer 14. Taking the case in which two insulating layers are formed on the substrate by conventionally performing mask plate technology for 6 times as an example, when light is incident onto the bridge structure 20, because the second insulating layer is not used in the OGS touch screen provided by the embodiment of present invention, it would be appreciated from the above description that, in the OGS touch screen provided by this embodiment, because the metal lead 13 is covered by the insulating layer 14 provided on the first transparent electrode 11, it is allowed to eliminate one insulating layer and then alleviate the difference between light transmission or deflection, thus decreasing the possibility that the bridge location become visible, and at the same time, to reduce one process, thus improving production.

Third Embodiment

Referring to FIGS. 1 and 2 again, the embodiment of present invention provides a display device comprising any one of the above-described OGS touch screens. The display device may be a liquid crystal panel, an OLED panel, a cellphone, a tablet computer, a television, a display, a notebook computer, a digital photo frame, a navigator and any products or parts having display functions.

In the above embodiments, one insulating layer 14 and two layers of transparent electrodes (the first transparent electrode 11 and the second transparent electrode 15) are configured to form the bridge structure 20, it is possible to reduce the redundant insulating layer(s), when light is irradiated onto the bridge structure 20, the light has identical effects when being transmitted and reflected at the second transparent electrode 15, no difference about the light brightness would occur, thus reducing the possibility that the bridge structure 20 becomes visible, and improving the display effect of the display device.

Fourth Embodiment

The embodiment of present invention provides a method for manufacturing the OGS touch screen substrate bridge structure 20, the method comprises: forming a first transparent electrode 11 on the substrate 10, the first transparent electrode 11 comprising several sub-electrodes; forming an insulating layer 14 on the first transparent electrode 11; and forming a second transparent electrode 15 on the insulating layer 14, the second transparent electrode 15 keeping the sub-electrodes in electrical connection.

Because one insulating layer 14 and two layers of transparent electrodes (the first transparent electrode 11 and the second transparent electrode 15) are configured to form the bridge structure 20, it is possible to reduce the redundant insulating layer(s), when light is irradiated onto the bridge structure 20, the light has identical effects when being transmitted and reflected at the second transparent electrode 15, no difference about the light brightness would occur, thus reducing the possibility that the bridge structure 20 becomes visible, and improving the display effect of the display device.

In one example, forming of the second transparent electrode on the insulating layer, the second transparent electrode keeping the sub-electrodes in electrical connection, comprises: forming via holes 16 in the insulating layer 14 so as to expose each of the sub-electrodes; and forming a second transparent electrode 15 on the insulating layer 14, the second transparent electrode 15 being coupled with the sub-electrodes through the via holes 16.

With via holes 16 provided in the insulating layer 14, it is achieved that the second transparent electrode 15 keeps several sub-electrodes in electrical connection.

The embodiment of present invention also provides a method for manufacturing the OGS touch screen, and this method comprises the method for manufacturing the above OGS touch screen substrate bridge structure 20.

In this method, one insulating layer 14 and two layers of transparent electrodes (the first transparent electrode 11 and the second transparent electrode 15) are configured to form the bridge structure 20, it is possible to reduce the redundant insulating layer(s), when light is irradiated onto the bridge structure 20, the light has identical effects when being transmitted and reflected at the second transparent electrode 15, no difference about the light brightness would occur, thus reducing the possibility that the bridge structure 20 becomes visible, and improving the display effect of the display device.

In one example of the method for manufacturing the OGS touch screen, before making the bridge structure 20, the method further comprises: forming a black matrix 12 on the substrate 10 and forming metal leads 13 above the black matrix 12 (at a side of the black matrix 12 away from the substrate 10). The insulating layer 14 covers the metal leads 13.

For the convenience of understanding the method provided by this embodiment, a detailed description about the steps thereof will be afforded in the following.

Figure 3A:
FIGS. 3a-3e are flow charts illustrating the manufacture of the bridge structure provided by an embodiment of present invention.

Step one, the process of forming a black matrix 12 is performed, for example, a patterning process (comprising exposure, development, for example) is employed to perform the first Mask procedure (this procedure may also be achieved by printing), as shown in FIG. 3a.

Figure 3B:
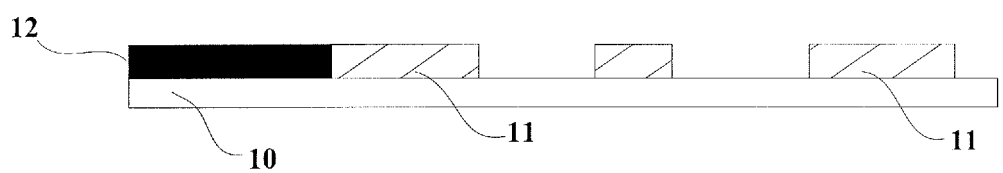

Step two, the first transparent electrode 11 is formed, for example, a patterning process (for example, comprising exposure, development, etching, stripping) is employed to perform the second Mask procedure, and this procedure forms an indium-tin-oxide (ITO) pattern, as shown in FIG. 3b.

Figure 3C:
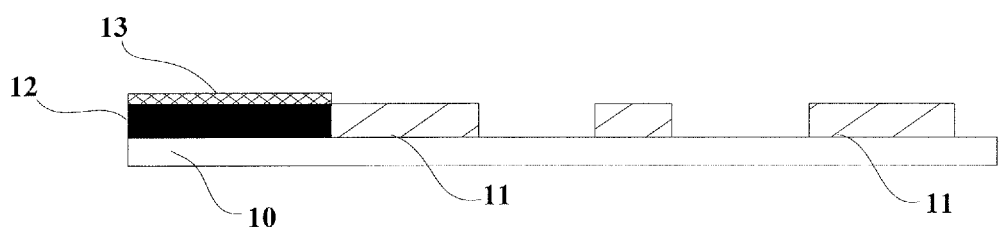

Step three, metal leads are formed, for example, a patterning process (for example, comprising exposure, development, etching, stripping) is employed to perform the third Mask procedure, this procedure completes the pattern of the metal leads, as shown in FIG. 3c.

Figure 3D:
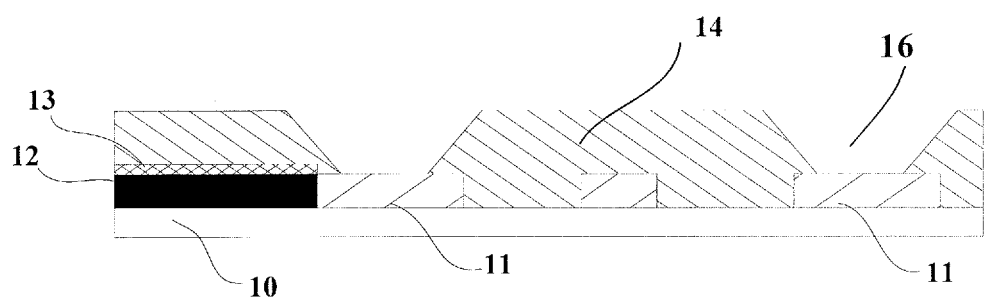

Step four, the insulating layer 14 is formed, for example, a patterning process (for example, comprising exposure, development) is employed to complete the fourth Mask procedure, and via holes 16 for the bridge structure 20 are formed above the first transparent electrode 11, at the same time, the metal within the bonding region (in which the sub-electrodes of the first transparent electrode 11 is in electrical connection with the second transparent electrode 15) is exposed, while other regions or metal leads 13 are protected with the insulating layer 14, as shown in FIG. 3d.

Figure 3E:
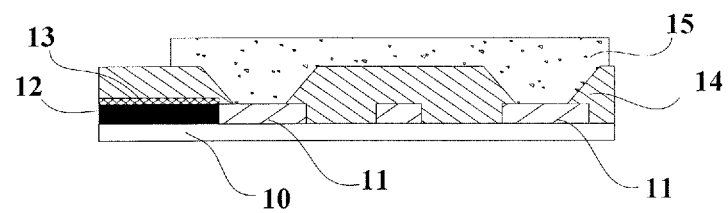

Step five, the second transparent electrode 15 is formed, for example, a patterning process (for example, comprising exposure, development, etching, stripping) is employed to complete the fifth Mask procedure, this procedure creates the bridge structure 20 through the connection at the via holes, and at the same time, the second transparent electrode 15 protecting the metal leads is formed at the bonding region, while the material for the transparent electrodes at other regions is all etched off, as shown in FIG. 3e.

In the above embodiments, one insulating layer 14 and two layers of transparent electrodes (the first transparent electrode 11 and the second transparent electrode 15) are configured to form the bridge structure 20, it is possible to reduce the redundant insulating layer(s), when light is irradiated onto the bridge structure 20, the light has identical effects when being transmitted and reflected at the second transparent electrode 15, no difference about the light brightness would occur, thus reducing the possibility that the bridge structure 20 becomes visible, and improving the display effect of the display device.

The above description is only an exemplary embodiment of the present invention, rather than limiting the protective scope of the present invention, and the protective scope of the present invention is defined by the attached claims.

The present application claims the priority of the Chinese patent application No. 201410462843.3 filed on Sep. 11, 2014, the entirety of which is incorporated herein by reference as a part of the present application.

What is claimed is:

1. A one-glass-solution (OGS) touch screen substrate bridge structure, comprising one insulating layer and two layers of transparent electrodes provided on the substrate,
    wherein the two layers of transparent electrodes are a first transparent electrode and a second transparent electrode,
    the insulating layer is provided on the first transparent electrode, and the second transparent electrode is provided on the insulating layer,
    the first transparent electrode comprises a plurality of first sub-electrodes arranged at a certain spacing from each other,
    the second transparent electrode comprises a plurality of second sub-electrodes which are insulated with each other and arranged at a certain spacing from each other,
    each of the second sub-electrodes keeps only two adjacent first sub-electrodes in electrical connection.

2. The bridge structure according to claim 1, wherein the insulating layer is provided with via holes, through which the second transparent electrode is coupled with the first sub-electrodes.

3. A one-glass-solution (OGS) touch screen comprising the bridge structure according to claim 1.

4. The OGS touch screen according to claim 3, further comprising black matrixes arranged on the substrate and metal leads provided on the black matrixes, wherein the insulating layer covers the metal leads.

5. A display device comprising the one-glass-solution (OGS) touch screen according to claim 3.

6. A method for manufacturing a one-glass-solution (OGS) touch screen substrate bridge structure, comprising:
    forming a first transparent electrode on a substrate, wherein the first transparent electrode comprises a plurality of first sub-electrodes;
    forming an insulating layer on the first transparent electrode; and
    forming a second transparent electrode on the insulating layer, wherein the second transparent electrode comprises a plurality of second sub-electrodes which are insulated with each other and arranged at a certain spacing from each other, and each of the second sub-electrodes keeps only two adjacent first sub-electrodes in electrical connection.

7. The method for manufacturing the OGS touch screen substrate bridge structure according to claim 6, wherein via holes are formed in the insulating layer for exposing each of the first sub-electrodes;
    the second transparent electrode is formed on the insulating layer so that the second transparent electrode is coupled with the first sub-electrodes through the via holes.

8. A method for manufacturing a one-glass-solution (OGS) touch screen, comprising the method for manufacturing the OGS touch screen substrate bridge structure according to claim 6.

9. The method for manufacturing an OGS touch screen according to claim 8, further comprising, before making the bridge structure:
    forming black matrixes on the substrate and forming metal leads on above the black matrixes, the insulating layer covering the metal leads.

10. The OGS touch screen according to claim 3, wherein the insulating layer is provided with via holes, through which the second transparent electrode is coupled with the first sub-electrodes.

11. The OGS touch screen according to claim 10, further comprising black matrixes arranged on the substrate and metal leads provided on the black matrixes, wherein the insulating layer covers the metal leads.

12. The method for manufacturing an OGS touch screen according to claim 8, wherein via holes are formed in the insulating layer for exposing each of the first sub-electrodes;
    the second transparent electrode is formed on the insulating layer so that the second transparent electrode is coupled with the first sub-electrodes through the via holes.

13. The method for manufacturing an OGS touch screen according to claim 12, further comprising, before making the bridge structure:
    forming black matrixes on the substrate and forming metal leads on above the black matrixes, the insulating layer covering the metal leads.

14. The bridge structure according to claim 1, wherein each of the second sub-electrodes is in a shape of rectangle,
    only a partial portion of each first sub-electrode is overlapped with an adjacent second sub-electrode electrically connected with this first sub-electrode in a direction perpendicular to the substrate.

\* \* \* \* \*